United States Patent
Conticelli et al.

(10) Patent No.: US 7,764,523 B2
(45) Date of Patent: Jul. 27, 2010

(54) METHOD OF OPERATING A CONVERTER CIRCUIT

(75) Inventors: Fabio Conticelli, Dattwil (CH); Dirk Beiser, Enneturgi (CH); Patrick Bohren, Lenzburg (CH)

(73) Assignee: ABB Schweiz AG, Baden (CH)

( * ) Notice: Subject to any disclaimer, the term of this patent is extended or adjusted under 35 U.S.C. 154(b) by 620 days.

(21) Appl. No.: 11/812,444

(22) Filed: Jun. 19, 2007

(65) Prior Publication Data

US 2007/0296381 A1  Dec. 27, 2007

(30) Foreign Application Priority Data

Jun. 23, 2006  (EP) ................... 06405267

(51) Int. Cl.
*H02H 7/122* (2006.01)
(52) U.S. Cl. ............... 363/56.02; 363/56.03; 363/56.05
(58) Field of Classification Search ............... 323/237; 363/39, 40, 41, 56.01, 56.02–56.05
See application file for complete search history.

(56) References Cited

U.S. PATENT DOCUMENTS

| | | | |
|---|---|---|---|
| 4,723,189 A * | 2/1988 | Larsen et al. | 361/76 |
| 5,091,839 A * | 2/1992 | Gaul et al. | 363/41 |
| 5,475,559 A * | 12/1995 | Suzuki et al. | 361/76 |
| 5,615,095 A * | 3/1997 | Reynolds et al. | 363/56.02 |
| 5,751,138 A * | 5/1998 | Venkata et al. | 363/41 |
| 6,201,715 B1 | 3/2001 | Huggett et al. | |
| 7,480,161 B2 * | 1/2009 | Kataoka et al. | 363/41 |
| 2002/0044464 A1 | 4/2002 | Deng et al. | |
| 2002/0101749 A1 * | 8/2002 | Ulrich | 363/40 |

FOREIGN PATENT DOCUMENTS

WO   2004/081591 A1   9/2004

OTHER PUBLICATIONS

European Search Report dated Nov. 27, 2006.
Cataliotti A et al., "A time domain approach for IEEE Std 1459-2000 powers measurement in distorted and unbalanced power systems", Instrumentation and Measurement Technology Conference, 2004. IMTC 04.

* cited by examiner

*Primary Examiner*—Bao Q Vu
*Assistant Examiner*—Jue Zhang
(74) *Attorney, Agent, or Firm*—Buchanan Ingersoll & Rooney PC

(57) ABSTRACT

A method of operating a converter circuit is disclosed, wherein the converter circuit has a converter unit with a multiplicity of controllable power semiconductor switches and the converter unit is connected at the AC voltage end to an electrical AC voltage network. According to the method, the controllable power semiconductor switches are controlled by means of a control signal. To protect the converter circuit in the event of asymmetrical phase voltages occurring in an AC voltage network connected to the converter circuit, the phase voltages ($U_{Na}$, $U_{Nb}$, $U_{Nc}$) in the AC voltage network are determined, the negative sequence amplitude of the phase voltages ($U_{Nn,A}$) is calculated, the Park-Clarke transformation amplitude of the phase voltages ($U_{Ndq,A}$) is calculated, the negative sequence amplitude of the phase voltages ($U_{Nn,A}$) is monitored at a settable value, the Park-Clarke transformation amplitude of the phase voltages ($U_{Ndq,A}$) is monitored at a settable value and the controllable power semiconductor switches are locked by means of the control signal if the negative sequence amplitude of the phase voltages ($U_{Nn,A}$) exceeds the settable value or if the Park-Clarke transformation amplitude of the phase voltages ($U_{Ndq,A}$) falls short of the settable value.

13 Claims, 1 Drawing Sheet

METHOD OF OPERATING A CONVERTER CIRCUIT

RELATED APPLICATIONS

This application claims priority under 35 U.S.C. §119 to EP Application 06405267.3 filed in Europe on Jun. 23, 2006, the entire contents of which are hereby incorporated by reference in their entireties.

TECHNICAL FIELD

The disclosure relates to the field of power electronics. It is based on a method of operating a converter circuit.

BACKGROUND INFORMATION

Known converter circuits comprise a converter unit with a multiplicity of controllable power semiconductor switches, which are connected in a known way to the circuit of at least two switching voltage levels. A converter circuit of this type is shown in FIG. 1. At the AC voltage end, the converter unit 1 is connected to an electrical AC voltage network 2. In addition, a capacitive energy store 3 is connected to the converter unit 1, which is currently made up of one or more capacitors. In order to operate the converter circuit, a control device 4 is typically provided, which controls the controllable power semiconductor switches by means of a control signal S according to the method during operation of the converter circuit, wherein the control signal S is generated by means of a look-up table, in which control signals are permanently assigned to corresponding reference values, or by means of a modulator, which is based on pulse width modulation, particularly when the converter circuit is being operated in normal mode.

The problem with a converter circuit of this type is that where there are asymmetrical phase voltages $U_{Na}$, $U_{Nb}$, $U_{Nc}$ in the AC voltage network 2, i.e. different phase angles of the phase voltages $U_{Na}$, $U_{Nb}$, $U_{Nc}$ relative to one another and/or different amplitudes of the phase voltages $U_{Na}$, $U_{Nb}$, $U_{Nc}$ to one another and/or different frequencies of the phase voltages $U_{Na}$, $U_{Nb}$, $U_{Nc}$ to one another, the converter unit's power semiconductor switch may be damaged or even destroyed, since with this sort of asymmetry, for example, unwanted currents flow across the power semiconductor. This means that the availability of the converter circuit drops massively and maintenance of the converter circuit rises significantly.

SUMMARY

A method of operating a converter circuit is disclosed, by means of which the converter circuit can be protected in the event of asymmetrical phase voltages occurring in an AC voltage network connected to the converter circuit.

In an exemplary method of operating a converter circuit, the converter circuit has a converter unit with a multiplicity of controllable power semiconductor switches, wherein the converter unit is connected at the AC voltage end to an electrical AC voltage network and the controllable power semiconductor switches are controlled by means of a control signal. For example, the phase voltages of the AC voltage network are first determined, e.g., by measurement. After that, the negative sequence amplitude of the phase voltages and the Park-Clarke transformation amplitude of the phase voltages are calculated. Furthermore, the negative sequence amplitude of the phase voltages is monitored at a settable value and the Park-Clarke transformation amplitude of the phase voltages is monitored at a settable value. If the negative sequence amplitude of the phase voltages exceeds the settable value or if the Park-Clarke transformation amplitude of the phase voltages falls below the settable value, the controllable power semiconductor switches are locked by means of the control signal. By monitoring the negative sequence amplitude of the phase voltages and the Park-Clarke transformation amplitude of the phase voltages, any asymmetry in the phase voltages can be very easily detected, without each individual phase voltage having to be monitored in relation to its amplitude, phase angle and/or frequency. This means that monitoring costs can be kept very low, as only two variables, namely, the negative sequence amplitude of the phase voltages and the Park-Clarke transformation amplitude of the phase voltages, need to be monitored. Furthermore, the converter circuit may be advantageously shifted into a safe state in the aforementioned cases by locking the controllable power semiconductor switch on the converter unit, so that the power semiconductor switches on the converter unit are protected from damage. This makes the converter circuit highly robust when exposed to asymmetrical phase voltages occurring in the AC voltage network, which means, in addition, that a high availability of the converter circuit can be advantageously achieved combined with low maintenance costs.

BRIEF DESCRIPTION OF THE DRAWINGS

This and other objects, advantages and features of the present invention will become evident from the following detailed description of exemplary embodiments in conjunction with the drawing. In the figure.

The references used in the drawing and their meanings are summarised in the reference list. As a rule, identical parts are given the same reference in the figure. The exemplary embodiments are described as examples without any limiting effect.

DETAILED DESCRIPTION

Figure 1:
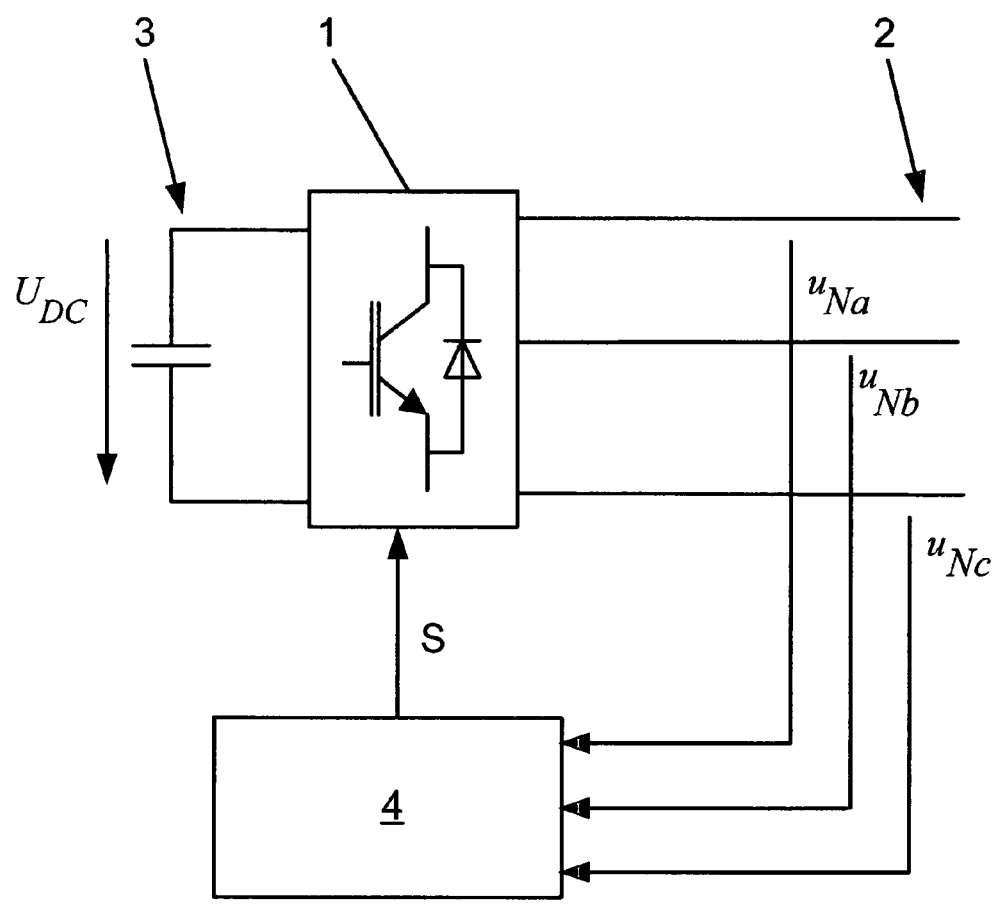
FIG. 1 shows an exemplary embodiment of a converter circuit, which is operated using an exemplary method as disclosed.

An exemplary embodiment of a converter circuit is shown in FIG. 1. The converter circuit comprises a converter unit 1 for switching at least two switching voltage levels. At the AC voltage end, the converter unit 1 is connected to an electrical AC voltage network 2. Furthermore, a capacitive energy store 3 is connected to the converter unit 1, which is typically formed by one or more capacitors. In order to operate the converter circuit, a control device 4 is provided, which controls the controllable power semiconductor switches by means of a control signal S according to the method during operation of the converter circuit, wherein the control signal S is generated by means of a look-up table, in which control signals are permanently assigned to corresponding reference values, or by means of a modulator, which is based on pulse width modulation.

With regard to an exemplary method of operating this sort of converter circuit, the phase voltages $U_{Na}$, $U_{Nb}$, $U_{Nc}$ of the AC voltage network 2 are first determined, e.g., by measurement. In addition, the negative sequence amplitude of the phase voltages $U_{Nn,A}$ and also the Park-Clarke transformation amplitude of the phase voltages $U_{Ndq,A}$ are calculated. Calculating the negative sequence amplitude of the phase voltages $U_{Nn,A}$ and the Park-Clarke transformation amplitude of the phase voltages $U_{Ndq,A}$ is dealt with in greater detail below. Furthermore, the negative sequence amplitude of the phase voltages $U_{Nn,A}$ is monitored at a settable value, while the Park-Clarke transformation amplitude of the phase voltages $U_{Ndq,A}$ is likewise monitored at a settable value. If the negative sequence amplitude of the phase voltages $U_{Nn,A}$ exceeds the settable value or the Park-Clarke transformation amplitude of the phase voltages $U_{Ndq,A}$ falls short of the settable value, the controllable power semiconductor switches are locked by means of the control signal S. By monitoring the negative sequence amplitude of the phase voltages $U_{Nn,A}$ and the Park-Clarke transformation amplitude of the phase voltages $U_{Ndq,A}$, an asymmetry in the phase voltages $U_{Na}$, $U_{Nb}$, $U_{Nc}$ can easily be detected without each individual phase voltage $U_{Na}$, $U_{Nb}$, $U_{Nc}$, for example, having to be monitored for their amplitude, phase angle and/or frequency. This means that monitoring costs can be kept very low, as only two variables, namely the negative sequence amplitude of the phase voltages $U_{Nn,A}$ and the Park-Clarke transformation amplitude of the phase voltages $U_{Ndq,A}$, need to be monitored. Furthermore, the converter circuit may be advantageously shifted into a safe state by locking the controllable power semiconductor switches on the converter unit 1 in the aforementioned cases, so that the power semiconductor switches on the converter unit 1 are protected from damage or destruction. This makes the converter circuit highly robust when exposed to asymmetrical phase voltages occurring in the AC voltage network, which means, in addition, that a high availability of the converter circuit can be advantageously achieved combined with low maintenance costs.

The phase voltages $U_{Na}$, $U_{Nb}$, $U_{Nc}$ are defined as follows:

$$U_{Na} = U_{Na,A} \cdot \sin(\omega t)$$
$$U_{Nb} = U_{Nb,A} \cdot \sin\left(\omega t - \frac{2\pi}{3}\right)$$
$$U_{Nc} = U_{Nc,A} \cdot \sin\left(\omega t - \frac{4\pi}{3}\right),$$

where $\omega = 2\pi F_{nom}$ and $F_{nom}$ is the nominal frequency of the electrical AC voltage network 2, for example $F_{nom} = 50$ Hz in a popular electrical composite AC voltage network or $F_{nom} = 16\frac{2}{3}$ Hz in an electrical traction AC voltage network. In order to determine the phase angle $\omega t$, the control mechanism 4 can comprise a phase locked loop.

The d-component of the Park-Clarke transformation of the phase voltages $U_{Nd}$ and the q-component of the Park-Clarke transformation of the phase voltages $U_{Nq}$ then produce $$U_{Nd} = U_{Na} \cdot \cos(\omega t) + \frac{1}{\sqrt{3}} \cdot (U_{Nb} - U_{Nc}) \cdot \sin(\omega t)$$
$$U_{Nq} = -U_{Na} \cdot \sin(\omega t) + \frac{1}{\sqrt{3}} \cdot (U_{Nb} - U_{Nc}) \cdot \cos(\omega t)$$

The Park-Clarke transformation amplitude of the phase voltages $U_{Ndq,A}$ is calculated using the aforementioned formulae as follows:

$$U_{Ndq,A} = \sqrt{U_{Nd}^2 + U_{Nq}^2}$$

In the case of asymmetrical phase voltages $U_{Na}$, $U_{Nb}$, $U_{Nc}$, these asymmetrical phase voltages $U_{Na}$, $U_{Nb}$, $U_{Nc}$ may be deconstructed into a positive sequence of phase voltages $U_{Np}$ and a negative sequence of phase voltages $U_{Nn}$, which are then generally produced as follows:

$$U_{Np} = U_{Ndp} + jU_{Nqp}$$
$$U_{Nn} = U_{Cr} \cdot e^{j2\omega t}$$

with $$U_{Ndp} = U_{Nd} - \text{Re}(U_{Cr})$$
$$U_{Nqp} = U_{Nq} - \text{Im}(U_{Cr})$$
$$U_{Cr} = \left(\frac{U_{Nd} - U_{Ndt1}}{2 \cdot \sin(\omega t1)} + j\frac{U_{Nq} - U_{Nqr1}}{2 \cdot \sin(\omega t1)}\right) e^{j(\frac{\pi}{2} - \omega t1)},$$

where $U_{Ndt1}$ is the d-component of the Park-Clarke transformation of the phase voltages $U_{Nd}$ delayed by the period t1 and $U_{Nqt1}$ is the q-component of the Park-Clarke transformation of the phase voltages $U_{Nq}$ delayed by the period t1.

The period t1 can be in the order of $$t1 = \frac{1}{4} \cdot \frac{1}{F_{nom}}.$$

With the negative sequence of the phase voltages $U_{Nn}$, this is, in particular, an estimate in the Park-Clarke reference system (dq-reference system) with an angle speed of $-\omega$.

The negative sequence amplitude of the phase voltages $U_{Nn,A}$ is calculated using the aforementioned formulae as follows $$U_{Nn,A} = |U_{Nn}|$$
$$= |U_{Cr} \cdot e^{j2\omega t}|$$
$$= \left|\left(\frac{U_{Nd} - U_{Ndt1}}{2 \cdot \sin(\omega t1)} + j\frac{U_{Nq} - U_{Nqt1}}{2 \cdot \sin(\omega t1)}\right) \cdot e^{j(\frac{\pi}{2} - \omega t1)}\right) \cdot e^{j2\omega t}\right|$$

In order to calculate the negative sequence amplitude of the phase voltages $U_{Nn,A}$ and also to calculate the Park-Clarke transformation amplitude of the phase voltages $U_{Ndq,A}$, the control mechanism 4 can comprise a calculating unit, which carries out the corresponding calculations according to the formulae given above.

Determination of the phase voltages $U_{Na}$, $U_{Nb}$, $U_{Nc}$ of the AC voltage network 2 can be continuous, so that calculations can always be carried out with the very latest values. Furthermore, calculations of the negative sequence amplitude of the phase voltages $U_{Nn,A}$ and the Park-Clarke transformation amplitude of the phase voltages $U_{Ndq,A}$ is likewise continuous, which means that the very latest negative sequence amplitude values for the phase voltages $U_{Nn,A}$ and Park-Clarke transformation amplitude values for the phase voltages $U_{Ndq,A}$ are always available. Monitoring of the negative sequence amplitude of the phase voltages $U_{Nn,A}$ based on the associated settable value and of the Park-Clarke transformation amplitude of the phase voltages $U_{Ndq,A}$ based on the associated settable value can also be continuous, so that any asymmetry occurring in the phase voltages $U_{Na}$, $U_{Nb}$, $U_{Nc}$ can always be reacted to quickly or according to the measures described earlier in the exemplary method. Likewise, a drop in the asymmetry of the phase voltages $U_{Na}$, $U_{Nb}$, $U_{Nc}$ can be reacted to in accordance with the measures described in detail below in the exemplary method.

If there is a drop in the asymmetry of the phase voltages $U_{Na}$, $U_{Nb}$, $U_{Nc}$ or if there is only a negligible amount of asymmetry present, this drop in the asymmetry of the phase voltages $U_{Na}$, $U_{Nb}$, $U_{Nc}$ or else the quasi-symmetry of the phase voltages $U_{Na}$, $U_{Nb}$, $U_{Nc}$ can be detected very easily and therefore simply by monitoring the negative sequence amplitude of the phase voltages $U_{Nn,A}$ based on the associated settable value and by monitoring the Park-Clarke transformation amplitude of the phase voltages $U_{Ndq,A}$ based on the associated settable value. If the negative sequence amplitude of the phase voltages $U_{Nn,A}$ then falls short of the settable value once again and if the Park-Clarke transformation amplitude of the phase voltages $U_{Ndq,A}$ once again exceeds the settable value, the controllable power semiconductor switches of the converter unit 1 are locked again by means of the control signal S, so that the converter circuit can once again work in normal mode. This means that the converter circuit can be used again on the electrical AC voltage network 2 as quickly as possible, therefore demonstrating further improved availability.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1 Converter unit
2 Electrical AC voltage network
3 Capacitive energy store
4 Control mechanism

What is claimed is:

1. A method of operating a converter circuit, wherein the converter circuit has a converter unit with a multiplicity of controllable power semiconductor switches and the converter unit is connected at the AC voltage end to an electrical AC voltage network,
   wherein the controllable power semiconductor switches are controlled by means of a control signal,
   wherein
   the phase voltages ($U_{Na}$, $U_{Nb}$, $U_{Nc}$) of the AC voltage network are determined,
   the negative sequence amplitude of the phase voltages ($U_{Nn,A}$) is calculated,
   the Park-Clarke transformation amplitude of the phase voltages ($U_{Ndq,A}$) is calculated,
   the negative sequence amplitude of the phase voltages ($U_{Nn,A}$) is monitored at a settable value,
   the Park-Clarke transformation amplitude of the phase voltages ($U_{Ndq,A}$) is monitored at a settable value,
   the controllable power semiconductor switches are locked by means of the control signal if
   the negative sequence amplitude of the phase voltages ($U_{Nn,A}$) exceeds the settable value or
   if the Park-Clarke transformation amplitude of the phase voltages ($U_{Ndq,A}$) falls short of the settable value.

2. The method according to claim 1, wherein the controllable power semiconductor switches are locked by means of the control signal if the negative sequence amplitude of the phase voltages ($U_{Nn,A}$) once again falls short of the settable value and
   if the Park-Clarke transformation amplitude of the phase voltages ($U_{Ndq,A}$) once again exceeds the settable value.

3. The method according to claim 1, wherein determination of the phase voltages ($U_{Na}$, $U_{Nb}$, $U_{Nc}$) of the AC voltage network is continuous.

4. The method according to claim 1, wherein calculation of the negative sequence amplitude of the phase voltages ($U_{Nn,A}$) is likewise continuous.

5. The method according to claim 1, wherein calculation of the Park-Clarke transformation amplitude of the phase voltages ($U_{Ndq,A}$) is continuous.

6. The method according to claim 1, wherein monitoring of the negative sequence amplitude of the phase voltages ($U_{Nn,A}$) based on the settable value is continuous.

7. The method according to claim 1, wherein monitoring of the Park-Clarke transformation amplitude of the phase voltages ($U_{Ndq,A}$) based on the settable value is continuous.

8. The method according to claim 2, wherein determination of the phase voltages ($U_{Na}$, $U_{Nb}$, $U_{Nc}$) of the AC voltage network is continuous.

9. The method according to claim 3, wherein calculation of the negative sequence amplitude of the phase voltages ($U_{Nn,A}$) is likewise continuous.

10. The method according to claim 4, wherein calculation of the Park-Clarke transformation amplitude of the phase voltages ($U_{Ndq,A}$) is continuous.

11. The method according to claim 5, wherein monitoring of the negative sequence amplitude of the phase voltages ($U_{Nn,A}$) based on the settable value is continuous.

12. The method according to claim 6, wherein monitoring of the Park-Clarke transformation amplitude of the phase voltages ($U_{Ndq,A}$) based on the settable value is continuous.

13. A converter unit for operating a converter circuit, the converter unit being connected at an AC voltage end to an electrical AC voltage network, the converter unit comprising:
   a plurality of controllable power semiconductor switches, the controllable power semiconductor switches being controlled by a control signal, wherein the control signal is generated based on a process comprising:
      determining phase voltages ($U_{Na}$, $U_{Nb}$, $U_{Nc}$) of an AC voltage network;
      calculating a negative sequence amplitude of the phase voltages ($U_{Nn,A}$);
      calculating a Park-Clarke transformation amplitude of the phase voltages ($U_{Ndq,A}$);
      monitoring the negative sequence amplitude of the phase voltages ($U_{Nn,A}$) at a settable value;
      monitoring the Park-Clarke transformation amplitude of the phase voltages ($U_{Ndq,A}$) at a settable value; and
      generating a control signal to lock the controllable power semiconductor switches are locked if the negative sequence amplitude of the phase voltages ($U_{Nn,A}$) exceeds the settable value or if the Park-Clarke transformation amplitude of the phase voltages ($U_{Ndq,A}$) falls short of the settable value.

* * * * *